(12) United States Patent
Travis

(10) Patent No.: US 6,710,369 B1
(45) Date of Patent: Mar. 23, 2004

(54) LIQUID METAL SOCKET SYSTEM AND METHOD

(75) Inventor: Joseph Briggs Travis, La Mesa, CA (US)

(73) Assignee: Applied MicroCircuits Corporation, San Diego, CA (US)

( * ) Notice: Subject to any disclaimer, the term of this patent is extended or adjusted under 35 U.S.C. 154(b) by 0 days.

(21) Appl. No.: 10/124,980

(22) Filed: Apr. 18, 2002

(51) Int. Cl.$^7$ ............................................... H01L 23/58
(52) U.S. Cl. ............................. 257/48; 29/600; 29/840
(58) Field of Search .......................... 257/48; 29/840, 29/857, 600, 527.2; 324/754, 765; 438/11, 14, 15, 18

(56) References Cited

U.S. PATENT DOCUMENTS

| | | | | |
|---|---|---|---|---|
| 5,007,163 A | * | 4/1991 | Pope et al. | 29/840 |
| 5,437,092 A | * | 8/1995 | Hartman et al. | 29/600 |
| 5,880,017 A | * | 3/1999 | Schwiebert et al. | 438/613 |

* cited by examiner

Primary Examiner—David Nelms
Assistant Examiner—Long Tran
(74) Attorney, Agent, or Firm—Law Office of Gerald Maliszewski; Gerald Maliszewski; Paul Maliszewski

(57) ABSTRACT

A liquid metal socket test fixture system and a method for the same are provided. The system has a circuit board top surface and a plurality of wells. A liquid metal compound forms balls in the wells. An IC package having a bottom surface with electrical contacts interfaces with the liquid metal compound in the wells. In some aspects of the system, the IC package has solid ball grid array (BGA) connectors attached to the bottom surface electrical contacts, interfacing with the liquid metal compound. Alternately, the liquid metal compound interfaces directly to the IC package bottom surface contacts. A gravity-tension frame overlies the circuit board top surface. The frame provides support in the horizontal plane so that the liquid metal balls remain aligned with the IC package electrical contacts. Typically, the liquid metal compound is a mixture of approximately 24% indium and 76% gallium.

19 Claims, 4 Drawing Sheets

LIQUID METAL SOCKET SYSTEM AND METHOD

BACKGROUND OF THE INVENTION

1. Field of the Invention

This invention generally relates to integrated circuit (IC) testing and, more particularly, to a liquid metal socket IC test fixture and a liquid metal socket test method.

2. Description of the Related Art

Because of the critical applications in which ICs are used, it is typical for an IC manufacturer to test parts before they are distributed. Conventional ceramic packages with formed attachment leads make the testing process convenient, and the part may be inserted and removed an indefinite number of times without damage. However, many ICs are sold as IC packages with ball grid array (BGA) or bump interfaces. These BGA interfaces can handle only a limited number of insertions before damage occurs. As a result, many of these IC packages with BGA interfaces are damaged during the testing process. IC packages with damaged BGA interfaces must have the BGA connections removed, and new BGA connections attached. The BGA reattachment process is expensive and can result in the irreparable damage to some IC packages. Therefore, IC manufacturers are constantly seeking methods of testing an IC package that are less detrimental to the BGA interfaces.

FIG. 1 is a depiction of an IC package test fixture using a pogo pin socket (prior art). The fixture uses free-floating gold plated pins held captive in a plastic dielectric. The frame is typically a combination of plastic and aluminum. The IC is held in place by a lid that either is a hinge and clasp, or two clasps. Pressure is applied through a torque screw that causes the pogo pins to connect with the BGA connectors. Such a fixture has the advantage of removable sockets that are not soldered in place. The fixture itself is able to withstand a high number of insertions without damage to the pins. Such a fixture is adequate for functional testing or simple validation. However, the lead inductance associated with the pogo pins degrades signals at high frequencies. Likewise, impedance mismatch between the BGA interface and the pogo pins affects signal integrity. The socket temperature coefficient is different from the IC package, requiring a technician to readjust socket connections under different temperature conditions. Also, the test fixture pins can deform the balls. Further, the fixture can't be used with a non-balled IC package.

FIG. 2 is a depiction of an IC package test fixture using a fuzz button socket (prior art). The so-called fuzz buttons are a material that closely resembles very small steel wool pads placed on a circuit board. The frame is typically a combination of plastic and aluminum. The IC is held in place by a lid that either is a hinge and clasp, or two clasps. Pressure is applied with a leaf spring tensioner.

Compared to pogo pins, the fuzz buttons have less inductance, they mate to the balls better, and they inflect fewer deformities and damage to the BGA balls. However, fuzz buttons have a very limited lifespan. The material deforms and must be replaced after only three or four insertions. Further, a fuzz button test fixture cannot be used with a non-balled IC package.

FIG. 3 is a depiction of an IC test fixture using a z-axis gold pin socket (prior art). Each z-axis pin includes multiple wire threads embedded in an elastomer type material. The frame is typically a combination of plastic and aluminum. The IC is held in place by a lid that either is a hinge and clasp, or two clasps. Pressure is applied with a leaf spring tensioner.

Advantageously, the z-axis pin is a removable socket, not soldered into place, that is easy to replace. The z-axis pin has less inductance, compared to pogo pins and, as a result, is capable of interfacing higher frequency signals. However, the z-axis pins can only be used for a very limited number of insertions and can't be used with a non-balled IC package.

FIG. 4 is a depiction of an IC test fixture using a diamond dust, or particle interconnect socket (prior art). Gold plated diamond dust is bonded directly to the circuit board, resembling patches of sand paper. This technique was originally developed for IC flat packs and J-lead style packages. The frame is typically a combination of plastic and aluminum. The IC is held in place by a lid that either is a hinge and clasp, or two clasps. Pressure is applied through a torque screw.

Advantageously, the diamond dust socket has a minimal inductance, promoting a wide bandwidth and high frequency capability. Also, the diamond dust socket is capable of a high number of insertions. However, the lack of uniformity in the diamond deposition, along with ball coplanar non-uniformities mandates that a higher pressure be exerted on the IC package during test. As a result, the balls can be damaged or deformed. Further, the diamond dust socket can't be used with a non-balled IC package.

It would be advantageous if an IC package test fixture could be developed with low-inductance sockets that were capable of many insertions, with damaging the IC package BGA connectors.

It would be advantageous if the above-mentioned socket could be used to test an IC package regardless of whether the IC package had a BGA interface.

SUMMARY OF THE INVENTION

The present invention uses a liquid metal compound deposited in small wells on a circuit board to form a connection with a BGA package. A gravity-tension frame is used, typically made of plastic. However, no tensioner is needed, as gravity is sufficient to ensure a good contact between the IC package and the liquid metal compound.

A test fixture using the present invention liquid metal sockets has a performance that closely resembles that of a soldered-down part. The fixture is capable of a very high number of insertions, as the socket doesn't wear out. The liquid metal socket can be used with balled or non-balled IC packages, and they do not deform or damage BGA balls.

Accordingly, a liquid metal socket test fixture system is provided. The system comprises a circuit board top surface and a plurality of wells formed in the circuit board top surface. A liquid metal compound forms balls in the wells. An IC package having a bottom surface with electrical contacts interfaces with the liquid metal compound in the wells. In some aspects of the system, the IC package includes solid ball grid array (BGA) connectors attached to the bottom surface electrical contacts, interfacing with the liquid metal compound. Alternately, the liquid metal compound interfaces directly to the IC package bottom surface contacts.

A gravity-tension frame overlies the circuit board top surface, with interior walls sections surrounding the wells. The frame provides support in the horizontal plane so that the IC package electrical contacts remain aligned with the liquid metal balls. Typically, the liquid metal compound is a mixture of approximately 24% indium and 76% gallium. Although other room temperature liquid metals such as mercury are also practical, but may require special handling as a hazardous material.

Additional details of the above-described liquid metal socket test fixture system, and a liquid metal socket method for electrically connecting an IC package are provided below.

DETAILED DESCRIPTION OF THE PREFERRED EMBODIMENTS

Figure 1:
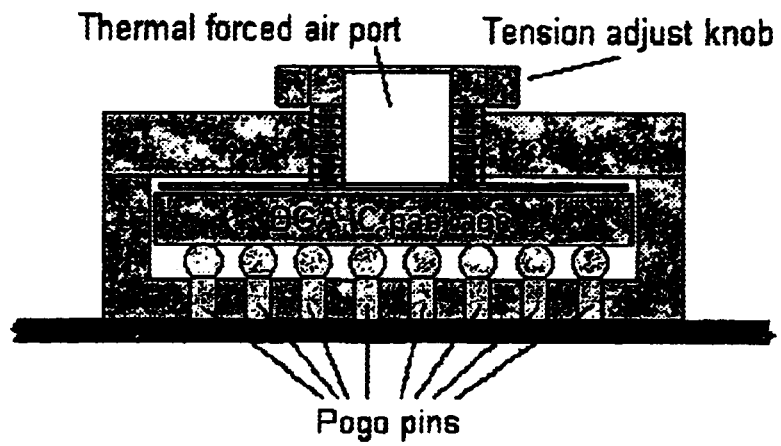
FIG. 1 is a depiction of an IC package test fixture using a pogo pin socket (prior art).
Figure 2:
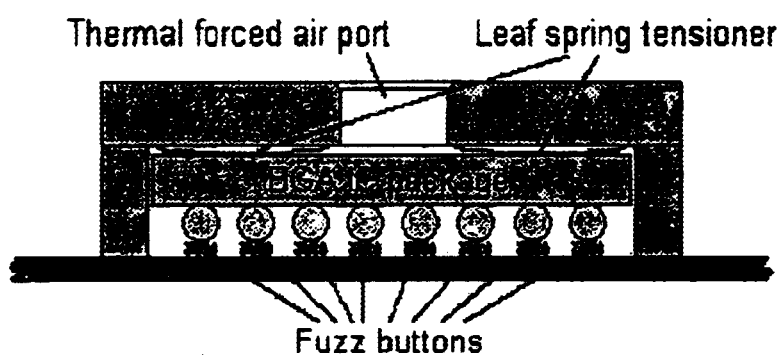
FIG. 2 is a depiction of an IC package test fixture using a fuzz button socket (prior art).
Figure 3:
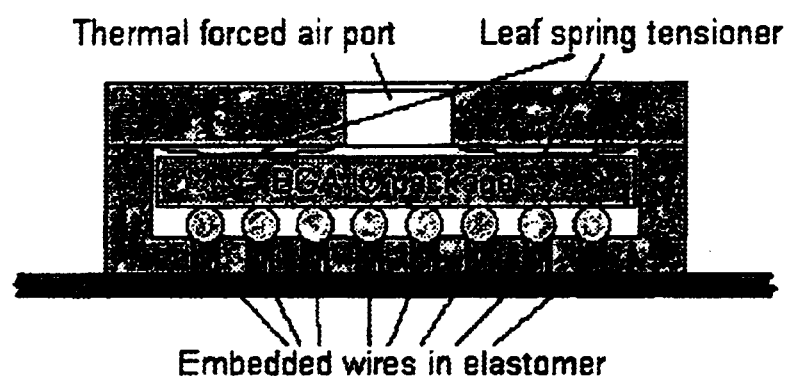
FIG. 3 is a depiction of an IC test fixture using a z-axis gold pin socket (prior art).
Figure 4:
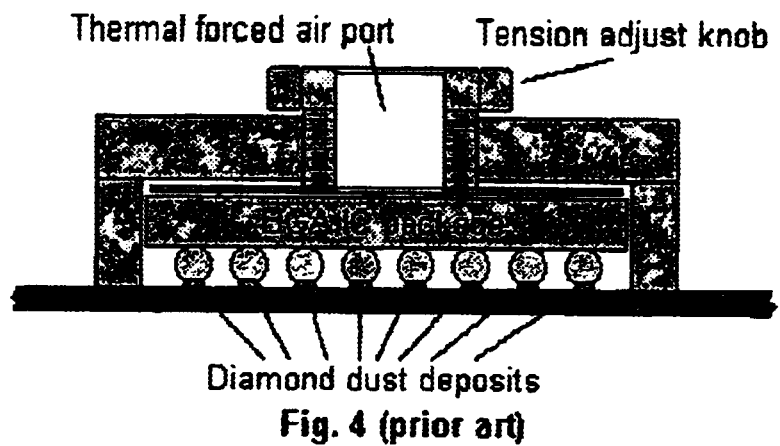
FIG. 4 is a depiction of an IC test fixture using a diamond dust, or particle interconnect socket (prior art).
Figure 5:
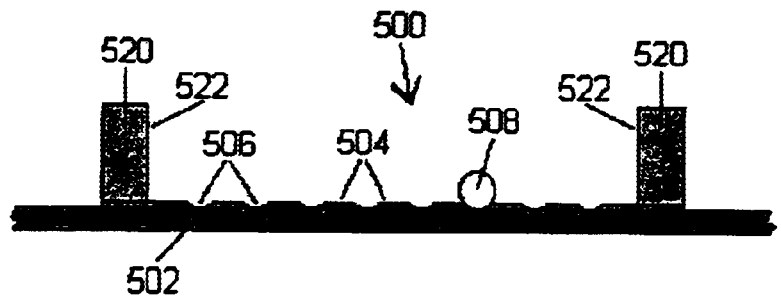
FIG. 5 is a partial cross-sectional view of the present invention liquid metal socket test fixture system.

FIG. 5 is a partial cross-sectional view of the present invention liquid metal socket test fixture system. The system 500 comprises a circuit board 502 with a top surface 504. A plurality of wells 506 are formed in the circuit board top surface 504. A liquid metal compound 508 fills the wells 506, although only one well is shown filled. Connections (not shown) are made with a via, circuit trace, wire, or other conventional connection means to interface the liquid metal in the wells to test fixture electrical circuits (not shown). Typically, the wells are circular in shape and have a diameter, that together with the skin tension of the liquid metal compound, results in the liquid metal compound being formed in the shape of balls. However, other wells shapes are possible and the liquid metal compound need not necessarily be formed as perfectly spherical balls.

Figure 6:
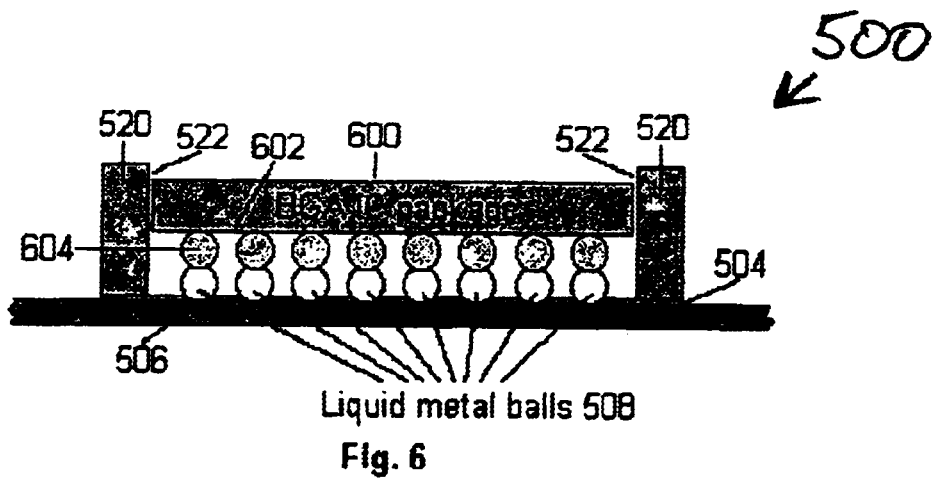
FIG. 6 is a partial cross-sectional view of FIG. 5 with the addition of an IC package.

FIG. 6 is a partial cross-sectional view of FIG. 5 with the addition of an IC package. The IC package 600 has a bottom surface 602 with electrical contacts (not shown) interfacing with the liquid metal compound 508 in the wells 506. More specifically, the IC package 600 includes solid ball grid array (BGA) connectors 604 attached to the bottom surface electrical contacts, interfacing with the liquid metal compound 508.

Figure 7:
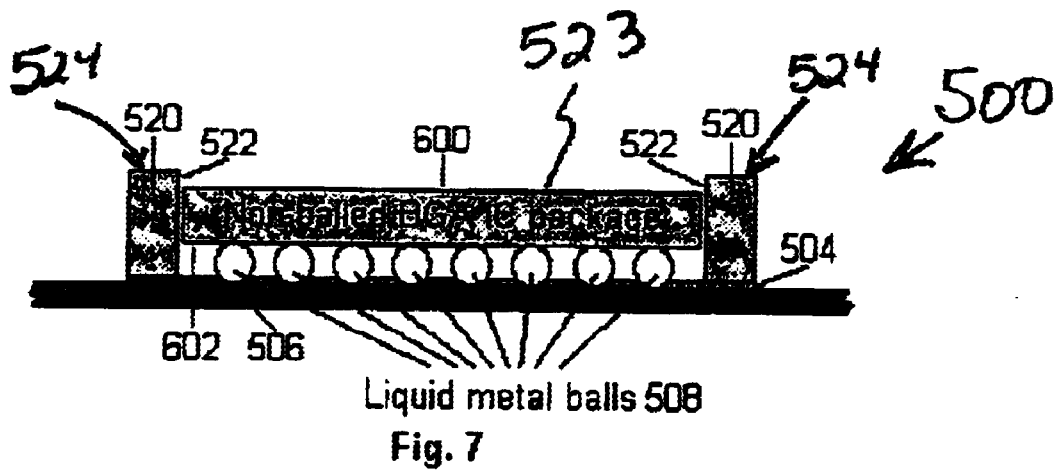
FIG. 7 is a partial cross-sectional view of FIG. 5 with the addition of an alternate IC package interface.

FIG. 7 is a partial cross-sectional view of FIG. 5 with the addition of an alternate IC package interface. In this aspect of the system 500, the IC package bottom surface 602 electrical contacts interface directly with the liquid metal compound 508. Alternately stated, solid metal BGA connectors are not attached to the IC package bottom surface 602.

As shown in FIG. 5, 6, or 7, a gravity-tension frame 520 overlies the circuit board top surface 504, with at least one interior wall 522 adjacent the wells 506.

Figure 8:
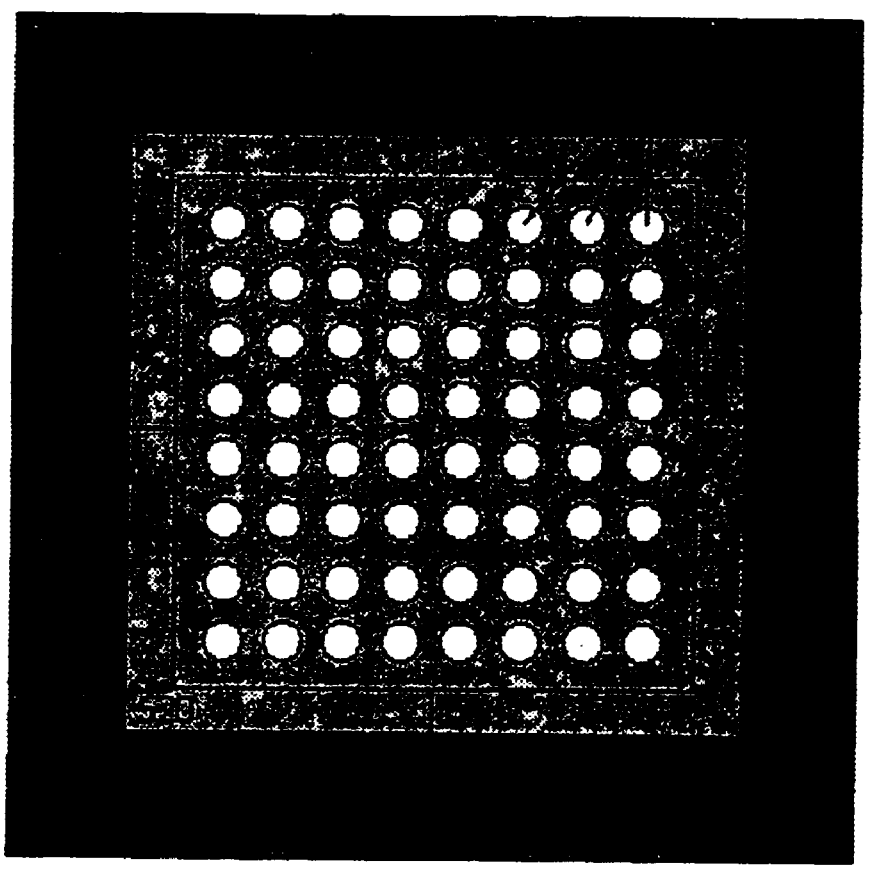
FIG. 8 is a plan view of the test fixture system of FIG. 5.

FIG. 8 is a plan view of the test fixture system 500 of FIG. 5. As shown, the frame 520 includes interior walls sections 522 surrounding the wells 506. Typically, the frame interior walls 522 form a rectangle surrounding the wells 506 that substantially match the shape of the IC package to be tested. The fixture relies upon gravity to ensure connection between the liquid metal compound and the IC package electrical contacts. However, the frame 520 supplies support in the horizontal plane (the x and y axis), so that the IC package cannot move side-to-side. Horizontal movement and alignment are an issue because of the lack of rigid connections between the IC package and the test fixture.

Some aspects of the system further comprise a low-pressure tensioner (not shown) connected to the frame 520, or having a fixed relationship with the frame 520. The tensioner would apply a low-pressure force to an IC package top surface. Ideally, no pressure need be applied. As noted above, the tensioner is not required for the IC package/liquid metal ball interface, as gravity is sufficient for electrical continuity when the IC package overlies the liquid metal balls. Rather, the low-pressure tensioner holds the IC package and metal balls in a fixed relationship that permits the frame 520 to be rotated or flipped in position without lose of electrical continuity. In one aspect of the system, the IC package top surface 523 (see FIG. 7) is approximately even with the frame top surface 524, and a simple lid (not shown) attached to the frame top surface 524 is used as the low-pressure tensioner.

As shown in FIG. 8, the plurality of wells 506 are formed in a particular pattern. The IC package bottom surface (not shown) has electrical contacts are formed in the same pattern. The above-mentioned frame ensure alignment between the wells and the IC package electrical contacts. Alternately, the test fixture may have a more wells formed than corresponding electrical contacts in the IC package under test. Then, only the wells that are intended to mate with the IC package are filled with liquid metal compound.

The liquid metal compound is typically chosen so that it is a liquid metal at a standard room temperature of approximately 25 degrees C., or less. Some materials that can be used in the liquid metal compound are mercury, gallium, and indium. Mercury has a melting point of approximately −38.9 degrees C. Hence, a mercury liquid metal socket would remain a liquid even during many cold-temperature tests. However, mercury is a hazardous material requiring special handling.

A liquid metal compound of approximately 24% indium and approximately 76% gallium has been found to be practical. This compound has a melting point of approximately 21 degrees. Therefore, at room temperatures of 25 degrees C., the compound is a liquid. At temperatures less that 21 degrees C., such a liquid metal compound would solidify. However, the metal balls remain conductive and support the electrical testing of an IC at temperatures below 21 degrees C. The compound returns to its liquid phase again when the test fixture returns to room temperature.

Figure 9:
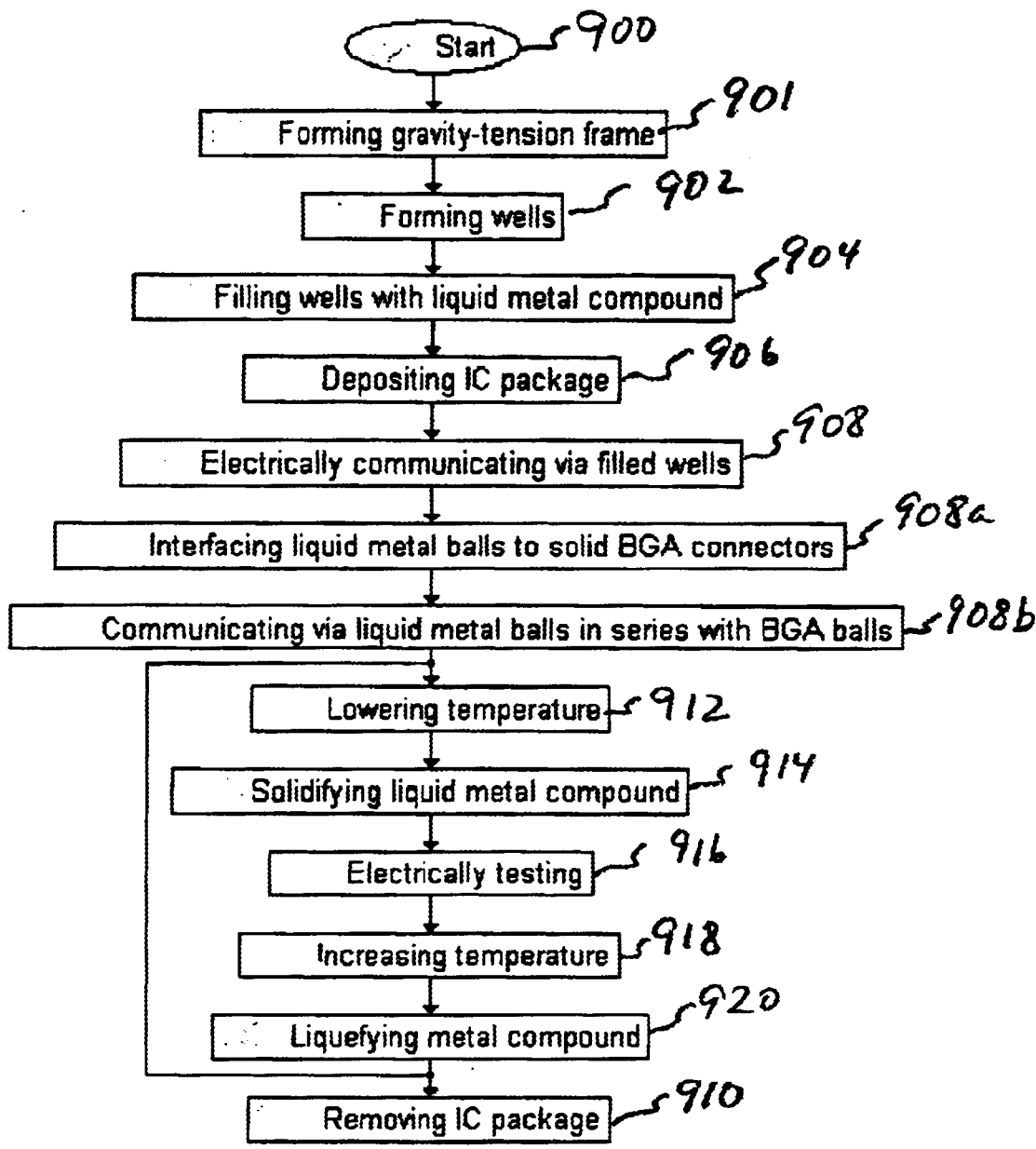
FIG. 9 is a flowchart illustrating the present invention liquid metal socket method for electrically connecting an IC package.

FIG. 9 is a flowchart illustrating the present invention liquid metal socket method for electrically connecting an IC package. Although the method is depicted as a sequence of numbered steps for clarity, no order should be inferred from the numbering unless explicitly stated. It should be understood that some of these steps may be skipped, performed in parallel, or performed without the requirement of maintaining a strict order of sequence. The method starts at Step 900. Step 902 forms a plurality of wells in a circuit board top surface. Step 904 fills the wells with a liquid metal compound. In some aspects, filling the wells with a liquid metal compound includes forming liquid metal balls. Step 906 deposits an IC package with electrical contacts on a bottom surface overlying the filled wells. Step 908 electrically communicates with the IC package electrical contacts via the metal compound in the filled wells. Step 910 removes the IC package from the circuit board top surface. Removing the IC package includes leaving the liquid metal compound in the wells.

In some aspects of the method, depositing an IC package with electrical contacts on a bottom surface in Step 906 includes depositing an IC package with solid ball grid array (BGA) connectors attached to the electrical contacts. Then, electrically communicating with the IC package electrical contacts via the metal compound in the filled wells in Step 908 includes substeps. Step 908a interfaces the liquid metal balls with the solid BGA connectors. Step 908b electrically communicates via the liquid metal balls in series with the solid BGA connectors. Alternately, when BGA connectors are not attached to the IC package, Step 908 includes directly interfacing the liquid metal balls to the IC package electrical contacts.

In some aspects a further step, Step 901, forms a gravity-tension frame overlying the circuit board top surface, with an interior wall at least partially surrounding the wells. Then, depositing an IC package with electrical contacts on a bottom surface overlying the filled wells in Step 906 includes depositing the IC package in the frame.

In other aspects, forming a plurality of wells in a circuit board top surface in Step 902 includes forming wells in a first pattern. Then, depositing an IC package with electrical contacts on a bottom surface overlying the filled wells in Step 906 includes depositing an IC package with electrical contacts formed in the first pattern.

In some aspects, filling the wells with a liquid metal compound in Step 904 includes filling the wells with a material selected from the group including mercury, gallium, indium, or combinations of the above-mentioned materials. Other conductive materials are known to be conductive at room temperature, such as cesium or rubidium. However, these materials are radioactive and require special handling.

In other aspects Step 904 includes filling the wells with a compound that is liquid at temperatures above 21 degrees C. In one particular aspect, the wells are filled with a compound that includes approximately 24% indium and approximately 76% gallium.

In some aspects of the method, depositing an IC package with electrical contacts on a bottom surface overlying the filled wells in Step 906 includes depositing the IC package at a temperature greater than 21 degrees C. Further steps are included. Step 912 lowers the temperature below 21 degrees C. Step 914 solidifies the liquid metal compound. Step 916 electrically tests the IC package. Step 918 increases the temperature above 21 degrees C. Step 920 liquefies the metal compound.

A liquid metal socket test fixture system and a method for using the liquid metal socket test fixture have been provided. A few examples have been given of a basic fixture configuration, however, the present invention is not limited to just these examples. Other variation and embodiments of the invention will occur to those skilled in the art.

I claim:

1. A liquid metal socket test fixture comprising:
   a circuit board top surface;
   a plurality of wells formed in the circuit board top surface;
   a liquid metal compound in the wells; and,
   a gravity-tension frame overlying the circuit board top surface, with at least one interior wall adjacent the wells.

2. The test fixture of claim 1 wherein the liquid metal compound is formed in the shape of balls.

3. The test fixture of claim 1 wherein the frame includes interior walls sections surrounding the wells.

4. The test fixture of claim 3 wherein the frame interior walls form a rectangle surrounding the wells.

5. The test fixture of claim 1 wherein the plurality of wells are formed in a first pattern.

6. The test fixture of claim 1 wherein the liquid metal compound is a material selected from the group including mercury, gallium, and indium.

7. The test fixture of claim 6 wherein the liquid metal compound is a liquid at temperatures above 21 degrees C.

8. The test fixture of claim 6 wherein the liquid metal compound is approximately 24% indium and approximately 76% gallium.

9. A liquid metal socket test fixture system comprising:
   a circuit board top surface;
   a plurality of wells formed in the circuit board top surface;
   a liquid metal compound in the wells;
   an integrated circuit (IC) package having a bottom surface with electrical contacts interfacing with the liquid metal compound in the wells; and,
   a gravity-tension frame overlying the circuit board top surface, with at least one interior wall adjacent the wells.

10. The system of claim 9 wherein the liquid metal compound is formed in the shape of balls.

11. The system of claim 9 wherein the IC package includes solid ball grid array (BGA) connectors attached to the bottom surface electrical contacts, interfacing with the liquid metal compound.

12. The system of claim 9 wherein the frame includes interior walls sections surrounding the wells.

13. The system of claim 12 wherein the frame interior walls form a rectangle surrounding the wells.

14. The system of claim 12 wherein the IC package has a top surface; and,
   the system further comprising:
      a low-pressure tensioner connected to the frame for applying a low pressure force to the IC package top surface.

15. The system of claim 9 wherein the plurality of wells are formed in a first pattern; and,
   wherein the IC package bottom surface electrical contacts are formed in the first pattern.

16. The system of claim 9 wherein the liquid metal compound is a material selected from the group including mercury, gallium, and indium.

17. The system of claim 16 wherein the liquid metal compound is a liquid at temperatures above 21 degrees C.

18. The system of claim 16 wherein the liquid metal compound is approximately 24% indium and approximately 76% gallium.

19. The system of claim 9 wherein the IC package bottom surface electrical contacts interface directly with the liquid metal compound.

* * * * *